United States Patent [19]

Asakawa et al.

[11] Patent Number: 5,064,337
[45] Date of Patent: Nov. 12, 1991

[54] HANDLING APPARATUS FOR TRANSFERRING CARRIERS AND A METHOD OF TRANSFERRING CARRIERS

[75] Inventors: Teruo Asakawa, Yamanashi; Tetsu Ohsawa, Kofu, both of Japan

[73] Assignee: Tokyo Electron Limited, Tokyo, Japan

[21] Appl. No.: 552,852

[22] Filed: Jul. 12, 1990

Related U.S. Application Data

[63] Continuation of Ser. No. 221,090, Jul. 19, 1988, abandoned.

[51] Int. Cl.[5] ............................................. B65G 1/133
[52] U.S. Cl. ..................... 414/639; 414/274; 414/275; 414/283; 414/786; 901/49; 98/115.3
[58] Field of Search ............... 414/742, 331, 787, 785, 414/223, 225, 274–277, 279, 786, 281–283, 641, 639; 901/17, 35, 47, 49

[56] References Cited

U.S. PATENT DOCUMENTS

| | | | |
|---|---|---|---|
| 3,185,320 | 5/1965 | Chasar et al. | 414/282 |
| 3,822,025 | 7/1974 | Loas | 414/277 X |
| 4,016,987 | 4/1977 | Stolzer | 414/283 |
| 4,364,706 | 12/1982 | Kranzlmuller | 414/283 X |
| 4,659,281 | 4/1987 | Aupperle | 414/787 |
| 4,708,566 | 11/1987 | Stolzer et al. | 414/283 X |
| 4,726,725 | 2/1988 | Baker et al. | 414/283 |
| 4,735,539 | 4/1988 | Hakkinen et al. | 414/282 X |
| 4,766,322 | 8/1988 | Hashimoto | 901/35 X |
| 4,770,590 | 9/1988 | Hugues et al. | 414/331 X |
| 4,775,281 | 10/1988 | Prentakis | 414/281 X |
| 4,802,809 | 2/1989 | Bonora et al. | 414/742 X |
| 4,867,629 | 9/1989 | Iwasawa et al. | 414/331 |

FOREIGN PATENT DOCUMENTS

| | | | |
|---|---|---|---|
| 159317 | 3/1983 | German Democratic Rep. | 414/283 |
| 20263 | 2/1978 | Japan | 414/275 |
| 20268 | 2/1978 | Japan | 414/275 |
| 52802 | 4/1980 | Japan | 414/283 |
| 48309 | 5/1981 | Japan | 414/274 |
| 124404 | 6/1986 | Japan | 414/276 |
| 127502 | 6/1986 | Japan | 414/277 |
| 275269 | 10/1964 | Netherlands | 414/279 |

*Primary Examiner*—David A. Bucci
*Attorney, Agent, or Firm*—Oblon, Spivak, McClelland, Maier & Neustadt

[57] ABSTRACT

A handling apparatus, used for handling a carrier of semiconductor wafers, comprises a first mechanism for transferring a carrier between a loader/unloader table and a storage compartment, and a second mechanism, for moving the first mechanism in both vertical and horizontal directions. The first mechanism includes an arm, a loading portion for loading the carrier, and an arm-rocking mechanism. The second mechanism moves the first mechanism to the loader/unloader table, picks up the carrier, and then moves the first mechanism to the storage compartment, where the arm is rocked, so as to discharge the object from the loading portion.

20 Claims, 12 Drawing Sheets

HANDLING APPARATUS FOR TRANSFERRING CARRIERS AND A METHOD OF TRANSFERRING CARRIERS

This application is a continuation of application Ser. No. 07/221,090, filed on July 19, 1988, now abandoned.

BACKGROUND OF THE INVENTION

1. Field of the Invention

This invention relates to a handling apparatus used to transfer carriers which store a plurality of semiconductor wafers or liquid crystal substrates, for example, and also to a method of transferring the carriers by using the handling apparatus.

2. Description of the Related Art

In the process of manufacturing semiconductor devices, semiconductor wafers are transferred in units of lots from one process to another. In other words, wafers are not transferred one by one from one process to another, but instead, a plurality of wafers are placed in box-shaped carriers and transferred in units of lots.

In general, a stocker, for temporary storage of a large number of carriers, is installed beside each unit or group of units such as processing units, wafer testing units, and the like, the purpose of this being to enable the wafers—in units of lots—to be processed in batches. Stated another way, since the processing time differs considerably from one type of processing unit to another, it is therefore necessary to provide means for temporary storage of carriers waiting to undergo processing or to be sent to the next process.

The flow of carriers will now be described briefly as follows:

The carriers are carried by robot from the preceding processing line to a stocker, which is made up of a number of storage compartments, and are stored there temporarily. Then, when desired, the carriers are taken out, one by one, from the storage compartments, and transferred to a processing unit. Then, after being processed by the processing unit in question, the processed wafers are returned to the carrier from which they were removed.

In putting the carriers in and taking them out of the stocker, the carriers are normally first placed on a loading/unloading table and then, they are transferred into and out of the storage compartments by a handling apparatus provided with a traveling and a holding function. To be more specific, the handling apparatus selects the storage compartment of the stocker, identified by address, to which it is going to store the carrier or from which it is going to take the carrier.

Since semiconductor wafers have a hyperfine pattern formed thereon, the wafer surface can easily be damaged even by very fine dust particles. In order to minimize contamination of the wafer surface by dust, it is essential that all handling of the wafers be conducted in a clean room. In the clean room, clean air is made to flow from the ceiling toward the floor to keep the room at a high level of cleanliness (with a smaller number of floating dust per unit volume).

A conventional handling apparatus, however, has a larger number of driving axes and a complicated structure, and thus, when a carrier is handled by such a apparatus, dust is produced by the drive mechanism, and notably degrades the cleanliness of the room. In order to handle semiconductor wafers of a high density integrated circuit pattern, an ultra-high level of cleanliness is required of the clean room. Using a conventional handling apparatus, this requirement cannot be met.

The conventional handling apparatus is structured such that, a carrier from above and the carrier storing section moves at a higher position than the carrier, thus disturbing the laminar air flow and degrading the cleanliness of the room. Furthermore, since the conventional handling apparatus has a complicated structure with a large number of driving axes, this means a high equipment cost and an economic disadvantage.

SUMMARY OF THE INVENTION

It is the first object of this invention to provide a carrier handling apparatus which produces little dust.

The second object of this invention is to provide a handling apparatus, wherein wafers stored in a carrier can be transferred in accordance with the direction of air flow. A more specific object of this invention is to provide a less expensive handling apparatus having a simplified structure made possible by reducing the number of driving axes.

According to an aspect of the present invention, the handling apparatus comprises first means for transferring an object from a first position to a second position, the first means including an arm member, a loading portion, provided for the arm member, for loading the object, and means for rocking the arm member; and second means, for moving the first means to the first position, picking up the object placed in the first position and loading the picked-up object onto the loading portion, and then moving the first means to the second position, where the arm member is rocked, so as to discharge the picked-up object from the loading portion.

It is desirable that the second means include vertical and horizontal moving means.

As for the vertical and horizontal moving means, various types of mechanism, such as a link mechanism, a gear mechanism, and a wrapping connector driving mechanism can be used.

It is desirable to use a ball screw and a nut for the vertical moving mechanism. It is also desirable to adopt a wheel traveling mechanism for the horizontal moving means. In this case, it is desirable to mount the first means and the vertical moving mechanism on a carriage.

It is desirable to provide the loading portion with sensors for prevention of contact with other parts.

It is desirable to provide a sensor to ensure there is nothing at the location where a carrier is to be placed. The reason is that if a carrier is put on top of another that already exists there, the wafers contained will be damaged.

It is desirable to provide a sensor to make sure that a carrier is mounted on the arm member.

It is also desirable to provide fingers for the loading portion to prevent a transferred object from falling out.

The main arms of the arm members are preferably bent like a boomerang.

The contour of the cover for the vertical moving means and rocking means is preferably streamlined. Further, the contour of the arm members is preferably formed in a smooth aerofoil shape.

For the means of rocking the arm members, various types of mechanism such as a link mechanism, gear mechanism or a wrapping connector driving mechanism can be adopted, but it is desirable to use a motor direct driving mechanism.

In addition, it is desirable to transfer a carrier by the handling apparatus between the loading/unloading table and the storage compartment in such a manner that the carrier is slanted by the arm members being slanted to allow the laminar flow of clean air to pass through the gaps between the wafers in the carrier. It is possible to use a single unit of a handling apparatus to transfer two or more carriers at the same time. To further improve the cleanliness of carrier being transferred, it is possible to provide the arm member with an air conditioning means to blow.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The preferred embodiments of the invention will now be described with reference to the accompanying drawings.

Figure 1:
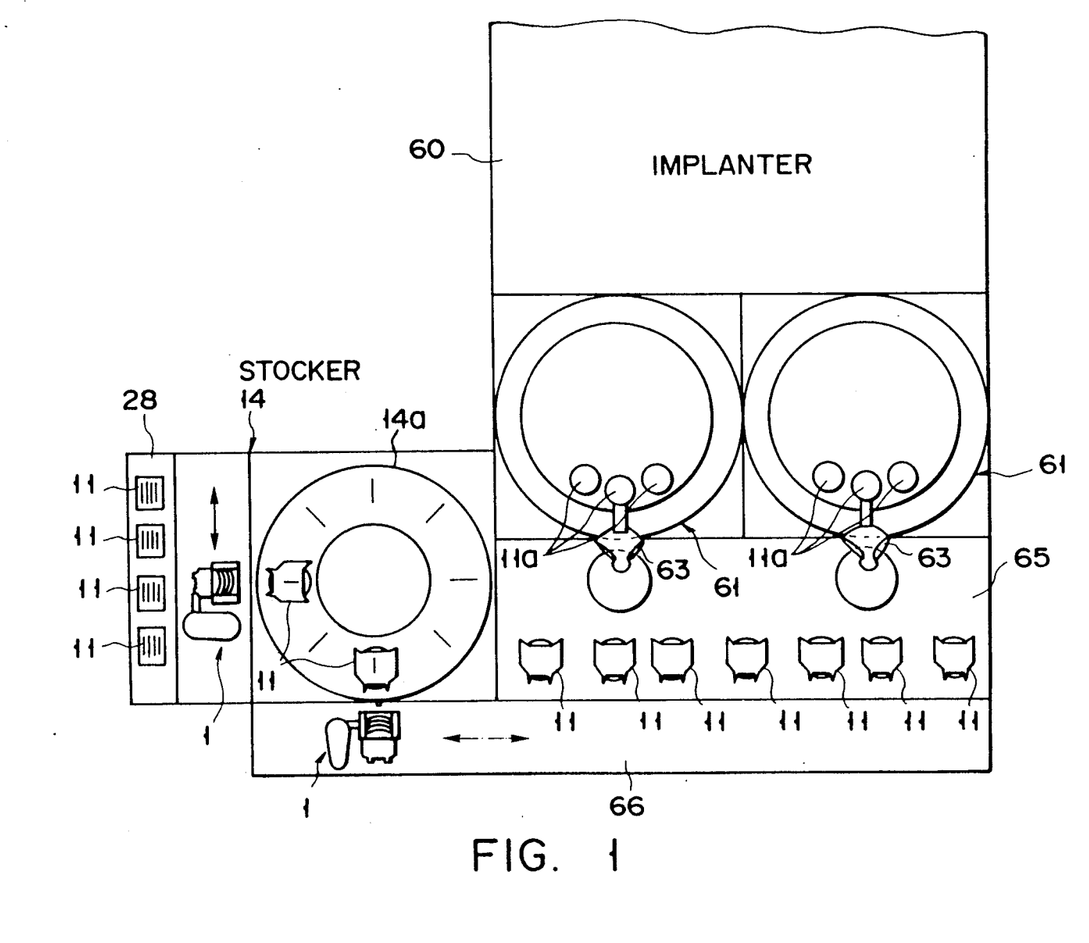
FIG. 1 is a plan view conceptually showing an implanter provided with a cylindrical stocker and a handling apparatus.

FIGS. 1 through 7 are views to explain the handling apparatus according to a first embodiment of the invention. Referring to FIG. 1, in a clean room, there is installed an implanter 60 by which ions of boron, for example, are accelerated using a high-voltage electric field and are driven into the pattern-forming surface of silicon wafers. Lid 61 for the chamber of implanter 60 is open at the entry side of implanter 60. Wafers 11a are taken out of carrier 11 by hands 63 one by one and are put on lid 61. When a specified number of wafers are put on lid 61, lid 61 is closed and ion implantation is executed. There is table 65 at the front of lid 61. Table 65 communicates with stocker 14 via passage 66. By the side of passage 66, there is a handling apparatus 1 which transfers carriers 11, which are stored in stocker 14, to table 65. Stocker 14 has at its front side loading/unloading table 28 and another handling apparatus 1 is provided between loading/unloading table 28 and stock case 14a. A robot transfer line (not shown) is installed from the equipment of the preceding process (not shown) up to the front side of loader/unloader table 28 and a transferring robot is used to load carriers 11 onto loading/unloading table 28. Loading/unloading table 28 has a number of receiving places.

Figure 2:
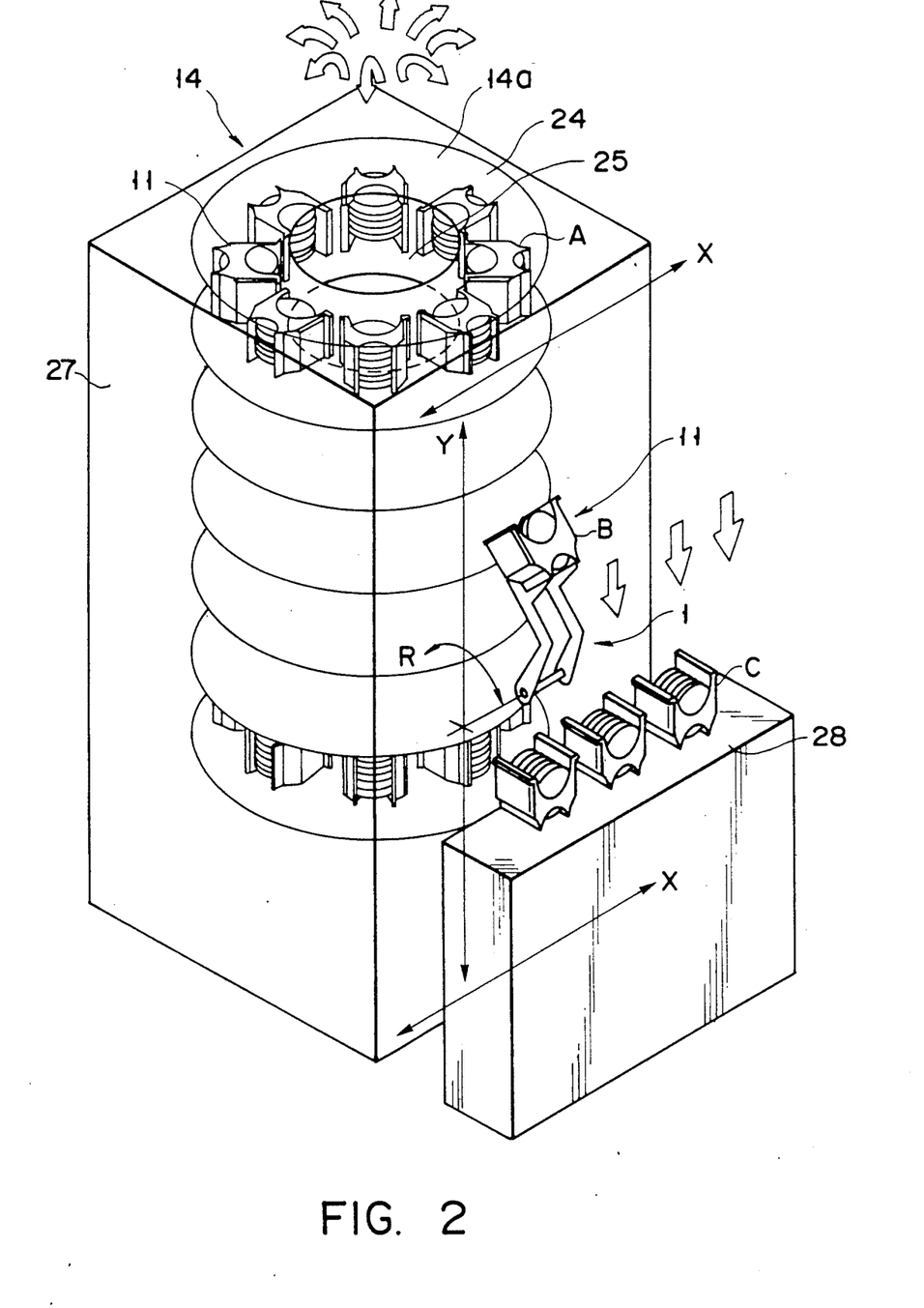
FIG. 2 is a perspective view conceptually showing a cylindrical stocker fitted with a handling apparatus.
Figure 3:
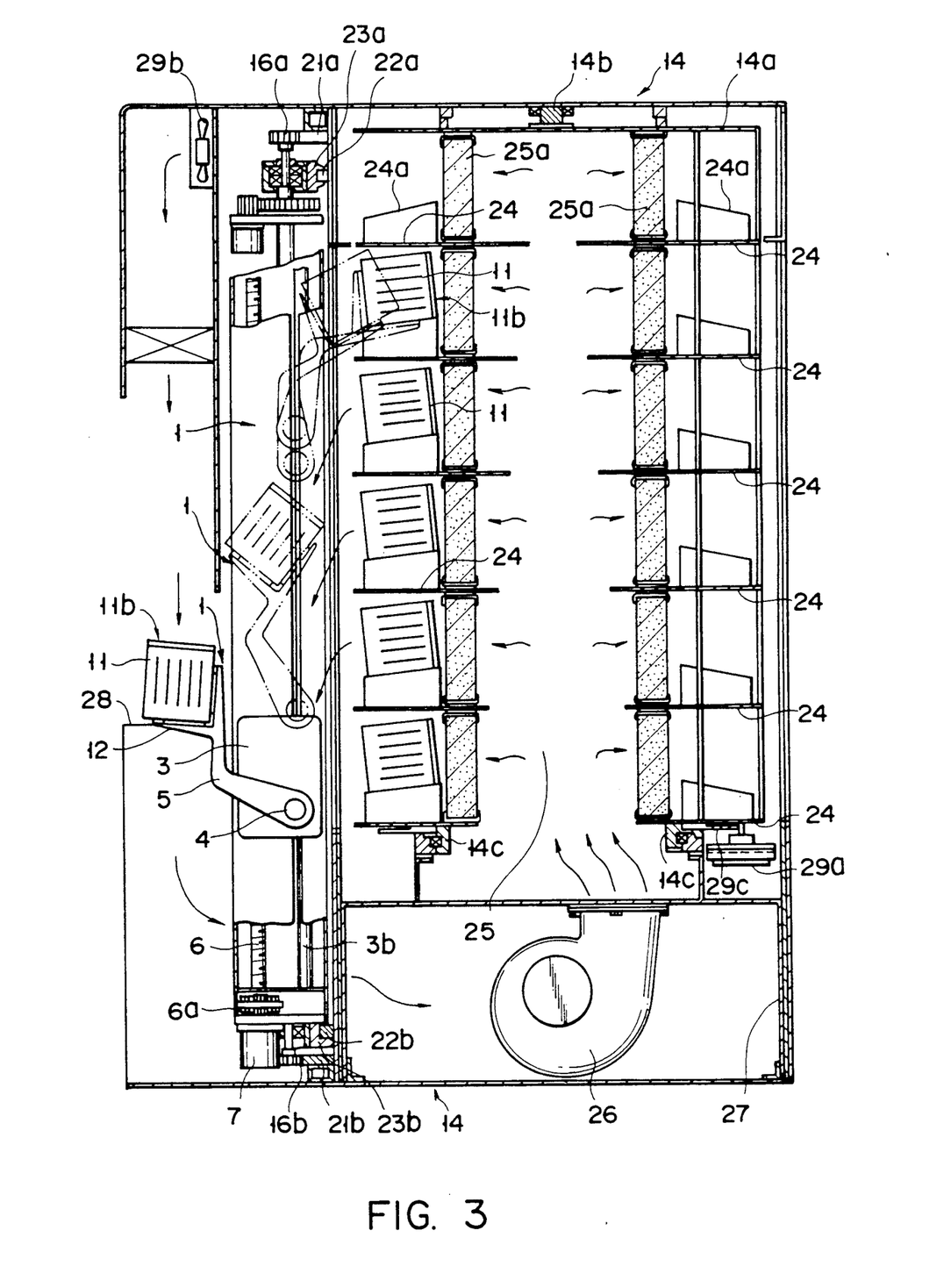
FIG. 3 is a longitudinal sectional view of the cylindrical stocker fitted with the handling apparatus, with a part of the stocker cut away for clarity.
Figure 4:
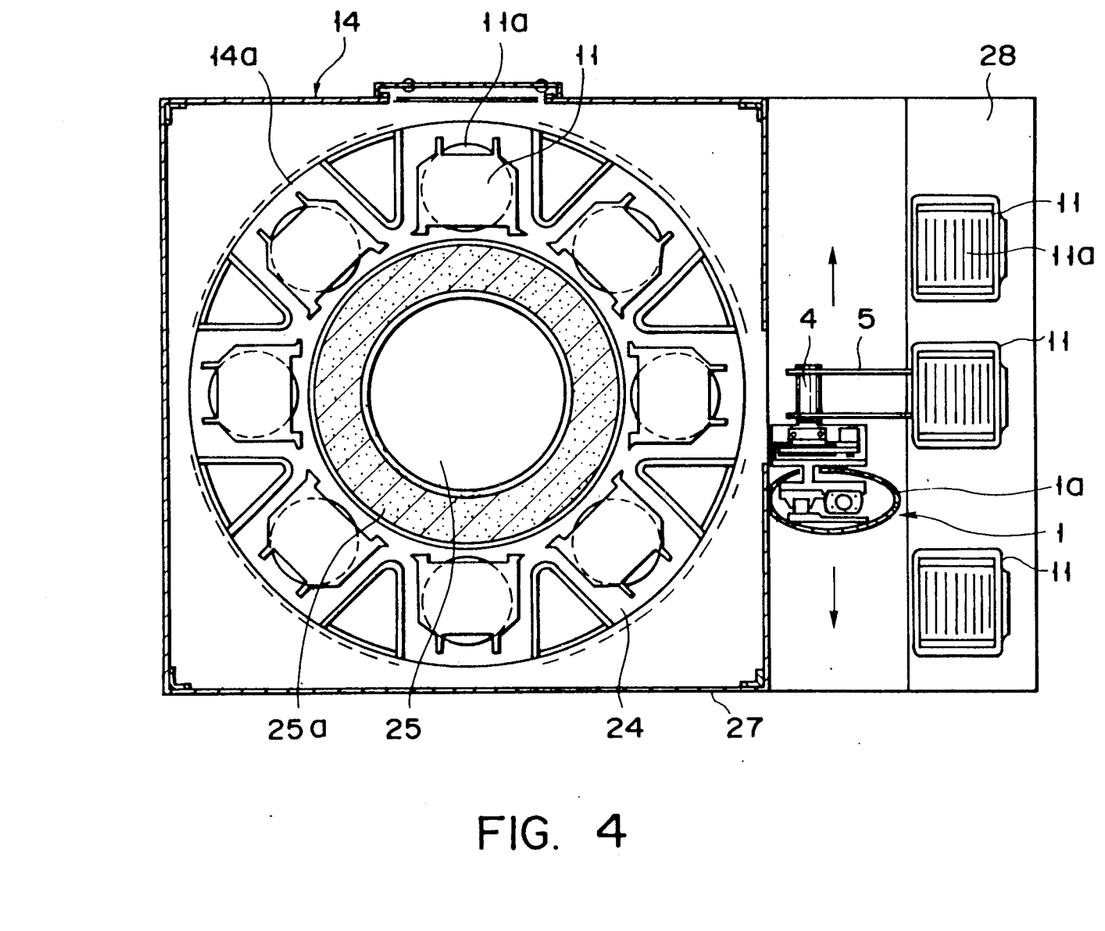
FIG. 4 is a partially cutaway plan view of cylindrical stocker fitted with the handling apparatus.

As shown in FIGS. 2 through 4, stock case 14a is in the form of a vertical cylinder and is surrounded by rectangular outer frame 27. Stock case 14a is held at its top and bottom to outer frame 27 by means of shafts 14b and 14c and bearings. Friction drive disk 29c is attached to the underside of lowest-stage shelf 24. Directly friction-driven by output shaft of motor 29a, stock case 14a rotates about shaft 14c. Stock case 14a has a plurality of shelves 24 and each shelf 24 is partitioned into a plurality of box-like storage compartments. Mounting base 24a with a forward-sloped upper surface is provided in each storage compartment and carrier 11 is mounted on base 24a.

Stock case 14a has space 25 formed in its central area such that clean air is supplied through high-performance air filter 25a radially from space 25 into the storage compartments of the shelves 24. Put differently, when lower fan 26 and upper fan 29b are put into motion, clean air circulates in stocker 14 like convection currents.

Figure 5:
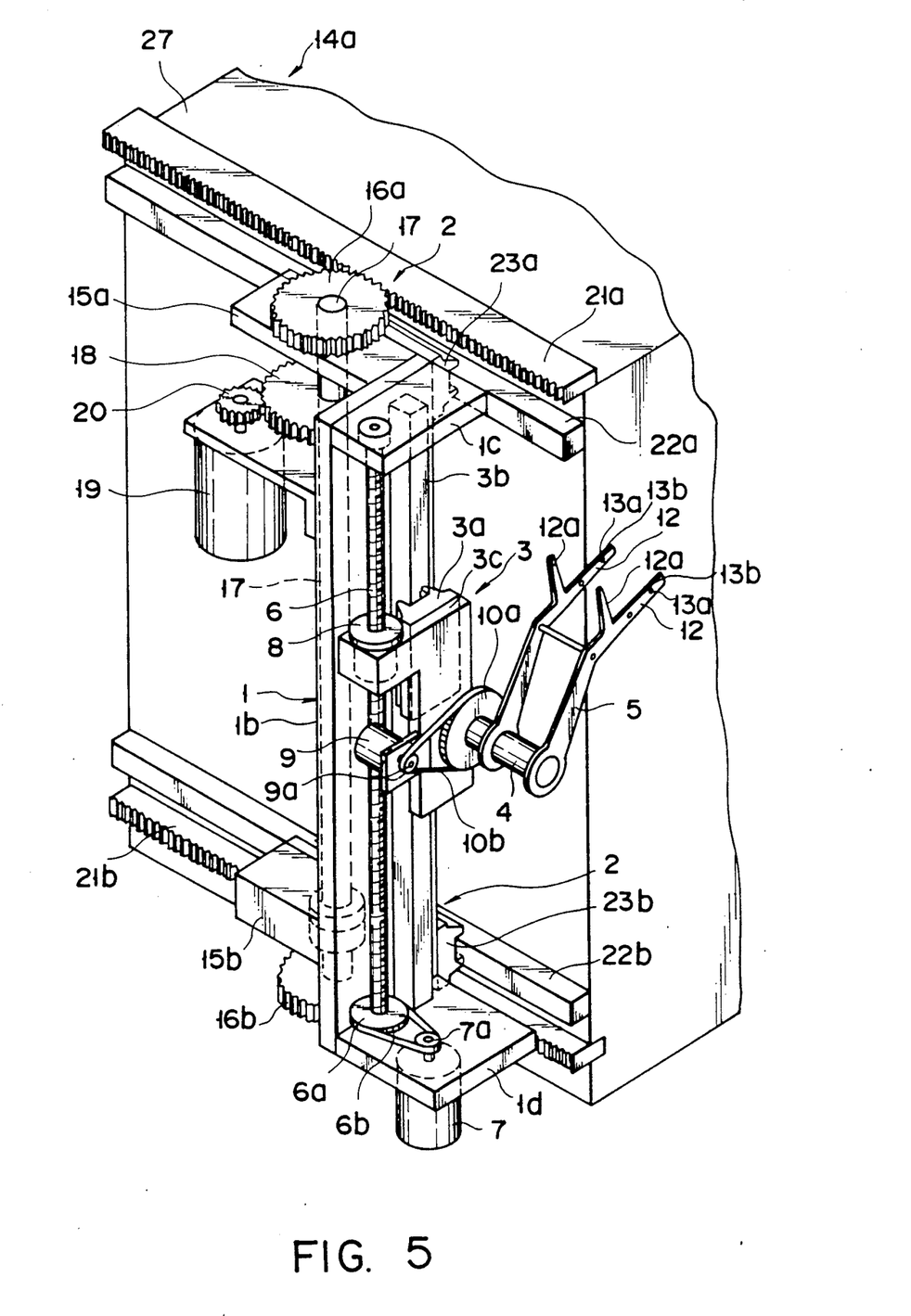
FIG. 5 is a perspective view of the handling apparatus of a first embodiment of the invention.
Figure 6:
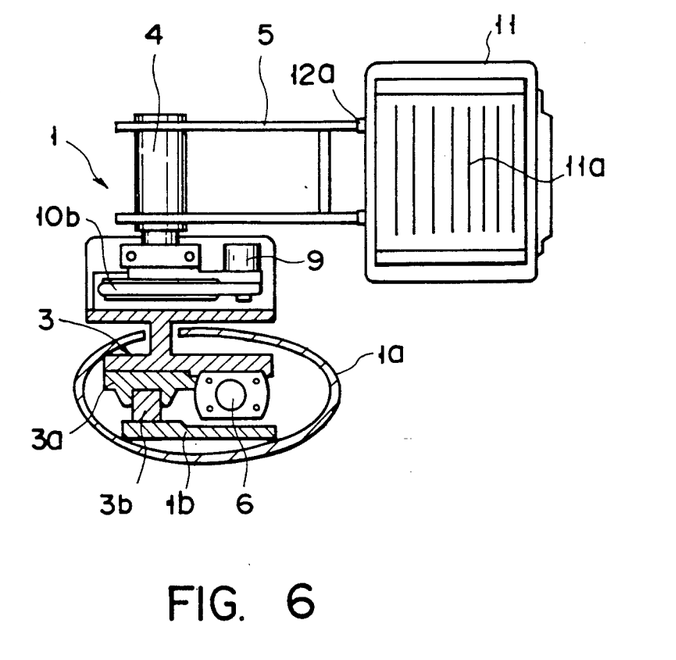
FIG. 6 is a partially cutaway plan view of the handling apparatus to reveal the inner mechanism.
Figure 7:
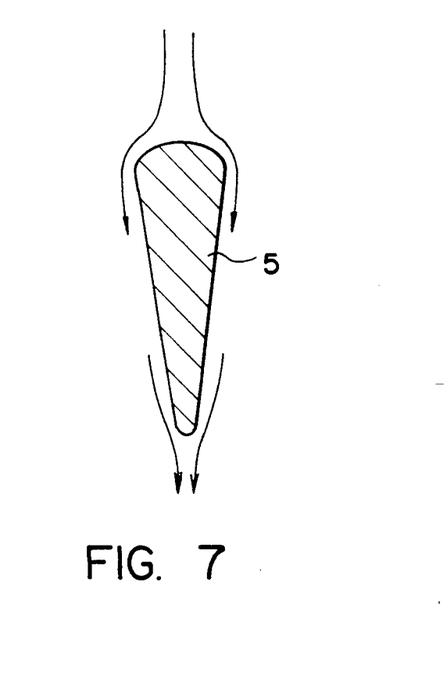
FIG. 7 is a transverse sectional view of an arm of the handling apparatus.

With reference to FIGS. 5 through 7, description will be made of handling apparatus 1 in greater detail, Handling apparatus 1 basically comprises three mechanisms: horizontal movement mechanism 2, vertical movement mechanism 3 and the rocking mechanism of arm members 5. Their movement is computer-controlled by a control unit not shown. Upper and lower racks 21a and 21b and upper and lower linear guide rails 22a and 22b of horizontal movement mechanism 2 are fixed to outer frame 27 of stocker 14 in such a way that they are mutually horizontal and separated by a specified distance. Vertical drive shaft 17 extends from upper rack 21a to lower rack 21b. Upper gear 16a engages with upper rack 21a and lower gear 16b engages with lower rack 21b, Reduction gear 18 is provided in the middle of drive shaft 17. Reduction gear 18 engages with gear 20 attached to the drive shaft of motor 19. Upper and lower frames 15a and 15b of horizontal movement mechanism 2 have linear guides 23a and 23b, respectively, upper guide 23a being fitted on upper rail 22a and lower guide 23b being fitted on lower rail 22b.

Frame 1b of vertical movement mechanism 3 is secured to upper and lower frames 15a and 15b of horizontal movement mechanism 2 such that frame 1b is parallel with drive shaft 17. Linear guide rail 3b is fixed in the longitudinal direction of frame 1b and guide 3a is fitted on rail 3b. Ball screw 6 is rotatably supported by frames 1c and 1d at the top and bottom ends of frame 1b such that ball screw 6 is parallel with rail 3b. Ball nut 8 in engagement with screw 6 is connected with guide 3a through member 3c. Belt pulley 6a is provided at the bottom end of screw 6 and belt 6b is applied between pulley 7a of the rotating shaft of motor 7 and belt pulley 6a.

The rocking mechanism of arm member 5 is mounted to member 3c. More specifically, shaft 4 of arm member 5 is attached to the side face of member 3c such that the shaft 4 is parallel with linear guide rails 22a and 22b. Belt pulley 10a is attached to shaft 4 and belt 10b is applied between pulley 9a of the rotating shaft of motor 9 and belt pulley 10a. In this case, since the diameter of belt pulley 10a is larger than the diameter of pulley 9a, the rotating speed of shaft 4 is reduced. Motors 7, 9 and 19, each having a reversing switch (not shown) in the respective control circuit, can be driven both in normal and reverse directions.

Arm member 5 comprises a pair of main arms, each of which is provided with a fixed finger 12a extending at a right angle from the main arm and a pair of sensors 13a and 13b attached to each of the end portion of main arm 12. To be more specific, each of main arm 12 are in a bent form like a boomerang, and the end portion of each main 12 and each finger 12a unite to form a carrier loading portion. For sensor 13a, a photo sensor utilizing laser beam, for example, is used to prevent a contact accident between the end portions of arms 12 and other parts or carriers. For sensor 13b, a photo sensor utilizing red light, for example, is adopted to check if carrier 11 is right above sensor 13b.

As shown in FIG. 6, the whole body of vertical movement mechanism 3 is enclosed by streamlined cover 1a (not shown in FIG. 5).

Reference is now made to FIG. 7, which shows arm member 5, the cross section of which is a smooth aerofoil. To be more concrete, arm member 5 is formed such that the lower section is narrower than the upper section so as not to disturb the laminar flow of clean air.

The component parts of handling apparatus 1 are made of a corrosion resisting material, such as a stainless steel or an aluminum alloy or either of these materials coated with tetrafluoroplastics.

Figure 8A:
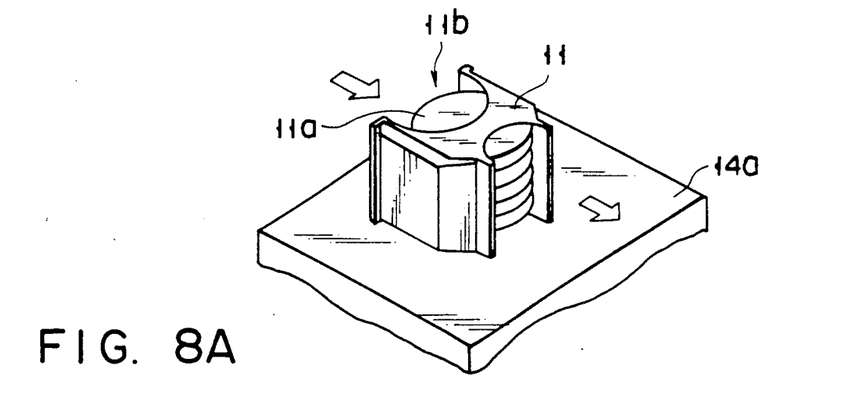
FIG. 8A is a perspective view schematically showing the position of the carrier stored in the stock case.
Figure 8B:
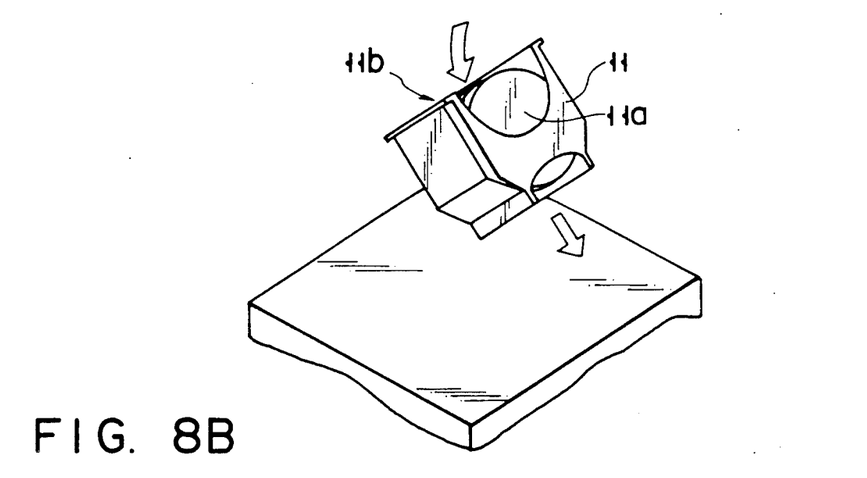
FIG. 8B is a perspective view schematically showing the position of a carrier when transferred by the handling apparatus.
Figure 8C:
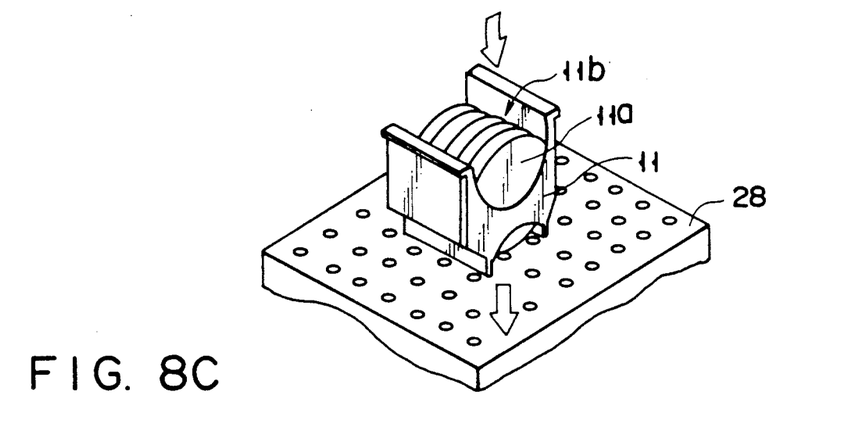
FIG. 8C is a perspective view schematically showing the position of a carrier on the loading/unloading table.

With reference to FIGS. 8A through 8C, FIG. 2, and FIG. 3 description will be made of a case where the handling apparatus according to the first embodiment to transfer a carrier from the loading/unloading table to the storage compartment. In FIGS. 8A to 8C, the numeral 11a indicates semiconductor wafers stored in carrier 11. The numeral 11b indicates the wafer entrance through which wafers enter the carrier.

As shown in FIG. 8C, carrier 11 is brought by the transferring robot onto loading/unloading table 28 in such a manner that the wafer entrance 11b faces up. The clean air in the vicinity of loading/unloading table 28 flows in a descending current coming down onto the top surface of loading/unloading table 28. When mounted on the top surface, the surfaces of wafers 11a in the carrier are parallel with the direction of the descending current. Therefore, the air can pass through a plurality of wafers 11a, reducing the air resistance of the whole body of wafer carrier 11. As a result, the presence of carrier 11 hardly disturbs the laminar flow of the clean air. In other words, the carrier which is in the condition indicated by "C" in FIG. 2 can be kept very clean.

Referring to FIG. 8B and FIG. 3, arm member 5 is slanted by the rocking mechanism so that the extreme ends of arm member 5 assume their highest position while a carrier is being transferred. In other words, carrier 11 being transferred is slanted from the mounted position on the loading/unloading table 28 to about 45° such that wafer entrance 11b faces diagonally upward. Meanwhile, the flow of the clean air changes from a horizontal current (at the region of storage compartment section 14a) to a descending current (at the region of loading/unloading table 28) in the area between storage compartment section 14a and loading/ unloading table 28. Therefore, the air can go through stored wafers 11a, decreasing the current resistance of the whole body of wafer carrier 11 while the wafer carrier is transferred. Thus, the transfer of carrier 11 scarcely causes the laminar flow of the clean air to be disturbed. In addition, the streamlined cover 1a for the vertical movement mechanism and the smooth airfoil-shaped arm members 5 contribute to a reduction of the current resistance of the whole handling apparatus 1, thereby reducing the disturbance resulting from the movement of apparatus 1 to a minimum. In short, the carrier which is in the condition indicated by "B" in FIG. 2 can be kept very clean. To further improve the cleanliness of carrier 11 being transferred, it is possible to provide arm member 5 with a fan-installed roof to blow.

As shown in FIG. 8A and FIG. 3, with the carriers stocked in the storage compartment, wafer entrance 11b is in a position squarely facing high-performance air filter 25a, Hence, the air can pass through the gaps between a plurality of wafer 11a. This decreases the air current resistance of wafer carrier 11 and therefore, the laminar flow of the clean air is hardly disturbed. The carrier which is in the condition indicated by "A" in FIG. 2 can be kept very clean. Thus, the carrier can be kept clean enough in all conditions.

Figure 9:
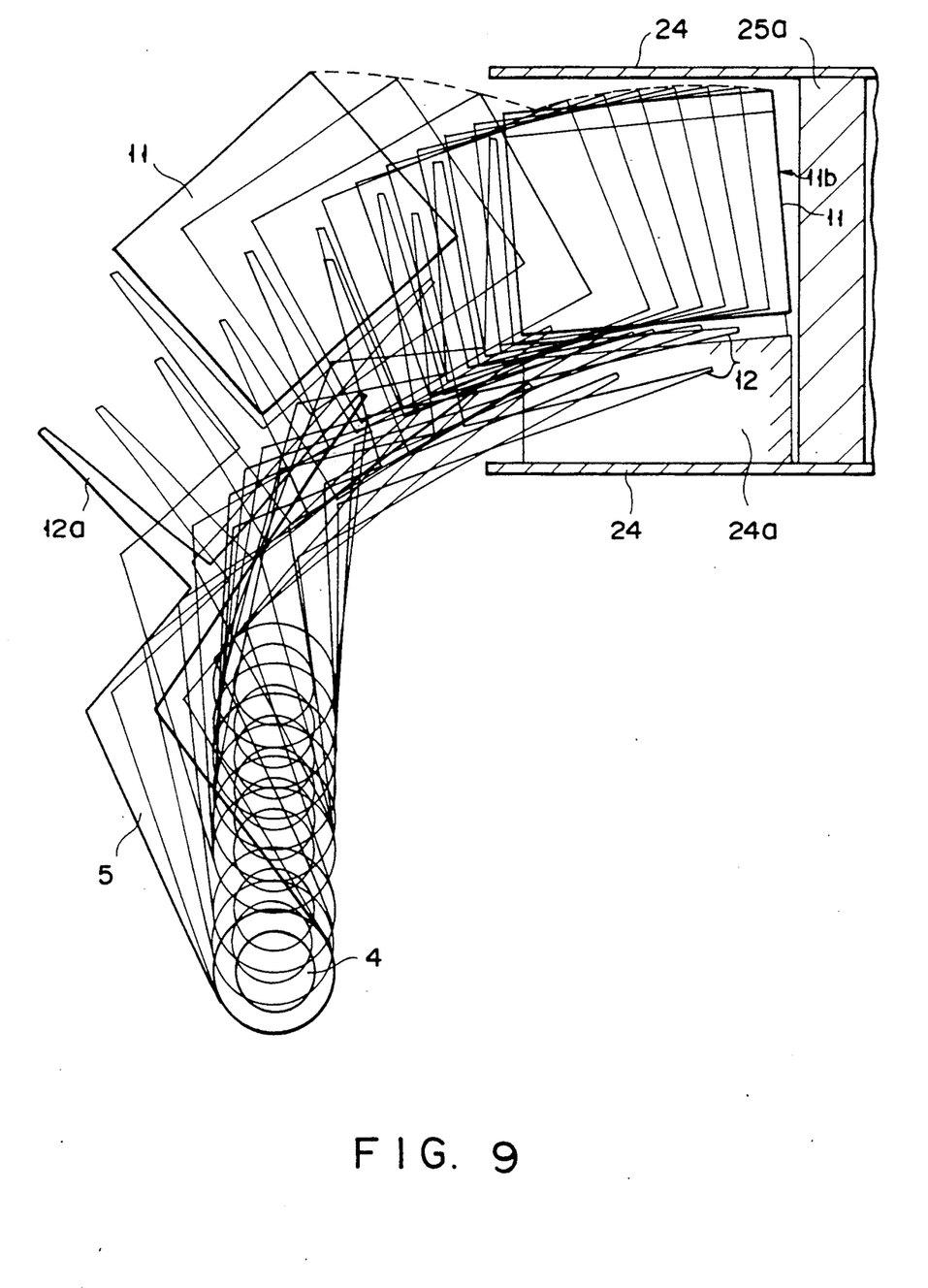
FIG. 9 is a view showing the loci of the arm and a carrier when a carrier is put into and taken out of a storage compartment of the storage section.

With reference to FIG. 9, description will now be made of a case where a handling apparatus is used to store carrier 11 in the storage compartment. Loading portion 12, 12a of arm member 5 holding the slanted carrier 11 is raised. At the same time, shaft 4 is turned slowly clockwise to insert carrier 11 into the storage compartment. When the carrier 11 has come to a specified position, arm member 5 is lowered a little and carrier 11 is put on mounting base 24a. To pull loading portion 12 out of shelf 24, the above steps are reversed.

As is clear from FIG. 9, the placement of a carrier on the mounting base in a narrow space has been realized by a combination of rocking and vertical movements.

So is the case with the motion of picking up a carrier from the storage compartment and the motion of placing a carrier on and picking it up from the loading/unloading table.

Figure 10:
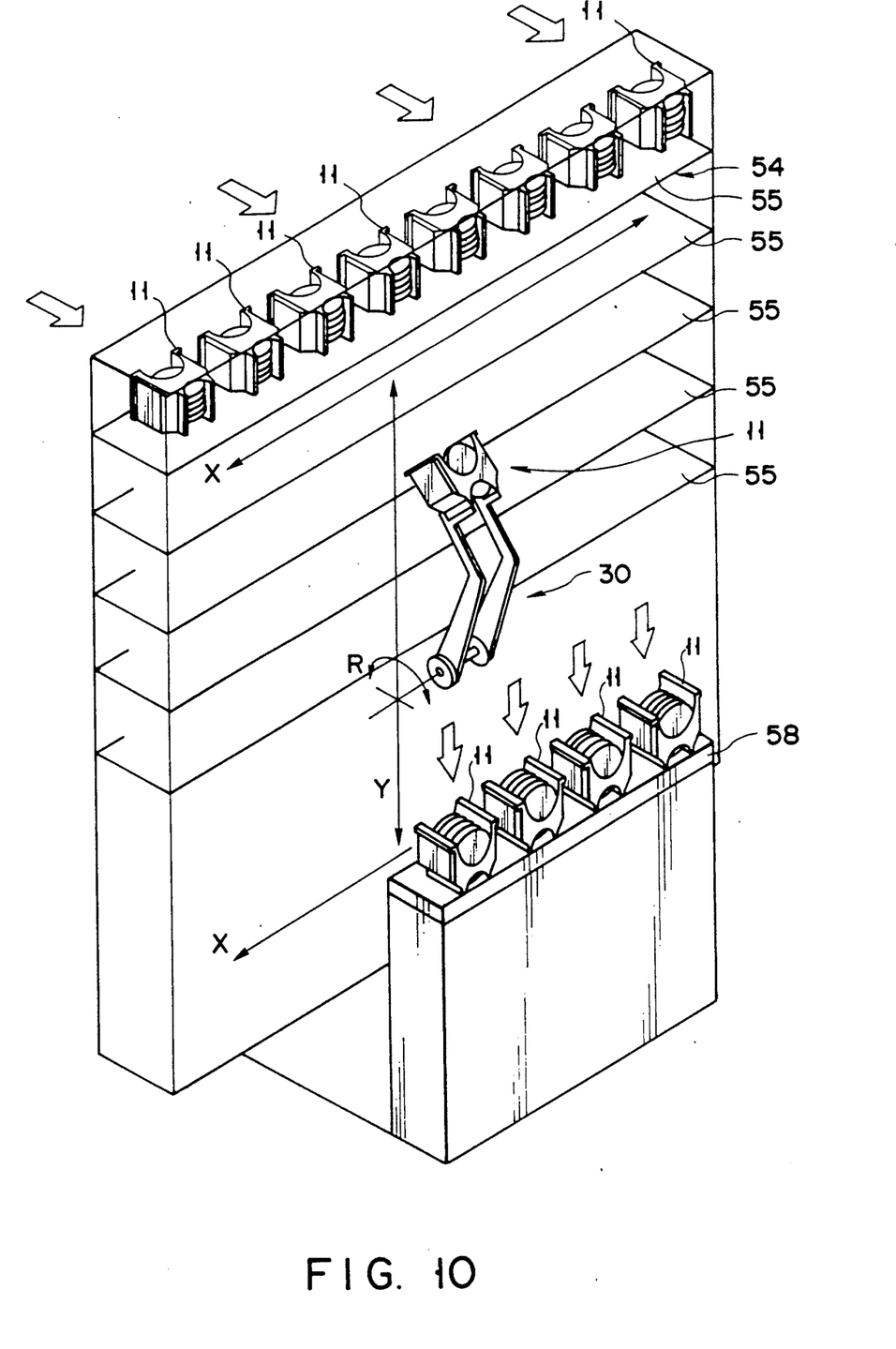
FIG. 10 is a perspective view conceptually showing a book shelf type stocker fitted with the handling apparatus.

With reference to FIG. 10, description will now be made of a series of movements by which carrier 11 on table 58 is transferred to the storage compartment. Arm member 5 is positioned at the starting position of the above-mentioned picking up motion by moving the handling apparatus in the X-axis and Y-axis directions. Then, carrier 11 on table 58 is picked up. After this, by moving the handling apparatus in the X-axis and Y-axis directions, arm member 5 is positioned at the start position of placement and carrier 11 is placed at a specified location on shelf 55. The reverse operation, that is, the operation of transferring a carrier from shelf 55 to table 58 can also be realized.

According to the first embodiment mentioned above, the number of axes has been reduced from four, which used to be standard, to three, thus simplifying the mechanism. As a result, the amount of dust generated has been reduced greatly. It ought to be noted that a carrier is moved in a three-dimensional movement and in that this handling apparatus three axes are the theoretically minimum number of driving axes.

The wafers stored in the carriers are arranged in a position which is the same as the direction of the clean air current and therefore, the carriers can be transferred with little disturbance of the laminar air flow. Further, since streamlined cover 1a is adopted and the arm member is designed in a smooth aerofoil shape, the disturbance of the current air flow caused by the movement of the whole handling apparatus is very little. Therefore, it is possible to maintain a required level of cleanliness and to handle semiconductor wafers for high-density integrated circuits day and night continuously in a clean room.

Mounting bases 24a in the storage compartments each have the forward-sloped top surface. This prevents the wafers in carrier 11 from being moved by a considerable degree of vibration.

Figure 11:
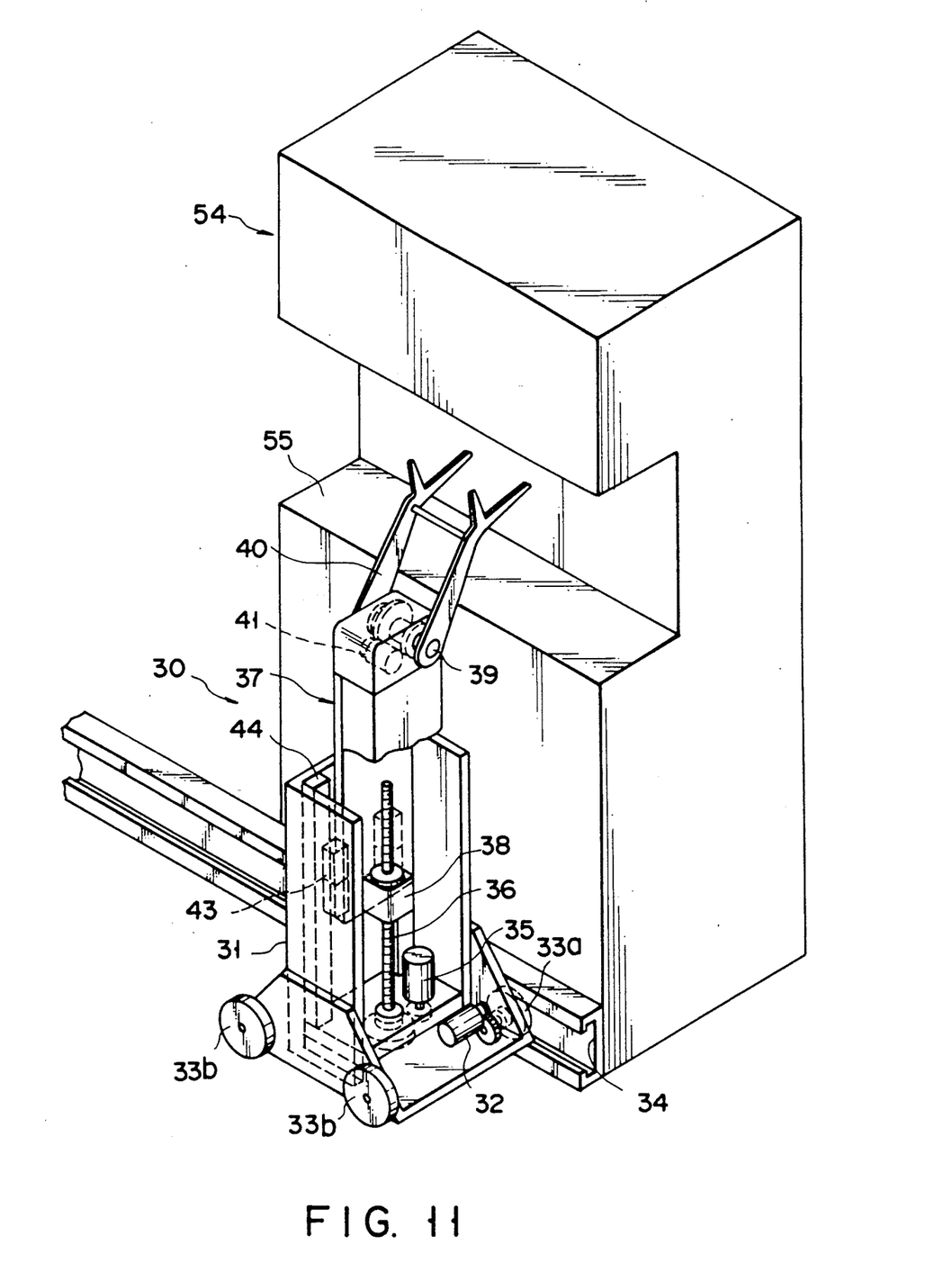
FIG. 11 is a perspective view showing a handling apparatus according to a second embodiment of the invention.

With reference to FIGS. 10 and 11, description will now be made to a handling apparatus according to a second embodiment. The items of the second embodiment common with the first embodiment will not be described here.

As shown in FIG. 10, handling apparatus 30 is installed for a book shelf type stocker and handling apparatus 30 transfers carriers 11 from loading/unloading table to stock case 54. Stock case 54 of the stocker has straight shelves 55 of multiple stages. Clean air is supplied through a high-performance air filter from the rear side of shelves 55 to their front side.

Referring to FIG. 11, mechanism 31 of handling apparatus 30 is installed a carriage having wheels 33a and 33b and can move horizontally along stock case 54. Guide rail 34 with a C-like cross section is attached horizontally on the front side. Wheels 33a are fitted in rail 34 and the gear of the driving shaft of first motor 32 engages with the gear of the shaft of wheel 33a. Ball nut 38 and linear guide 43 are secured to the frame of vertical movement mechanism 37. The bottom-end gear of ball screw 36 engages with the gear of the driving shaft of second motor 35. Linear guide 43 is slidably mounted to linear guide rail 44 fixed to the frame of mechanism 31. Arm member 40 is mounted through shaft 39 to the top portion of vertical movement mechanism 37. The gear of shaft 39 engages with the gear of the driving shaft of third motor 41. Shaft 39 is installed horizontally with guide rail 34. The construction of arm member 40 is substantially the same as with arm member 5 of the first embodiment described earlier. Each mechanism is enclosed by a streamlined cover (not shown).

According to the second embodiment of the invention. The mechanism of the handling apparatus is constructed in a modular unit and installed on a carriage. Hence, the mechanism can be easily mounted on and dismounted from the stocker and it is easy to adjust to an expansion of the stocker which may occur if circumstances require.

Figure 12:
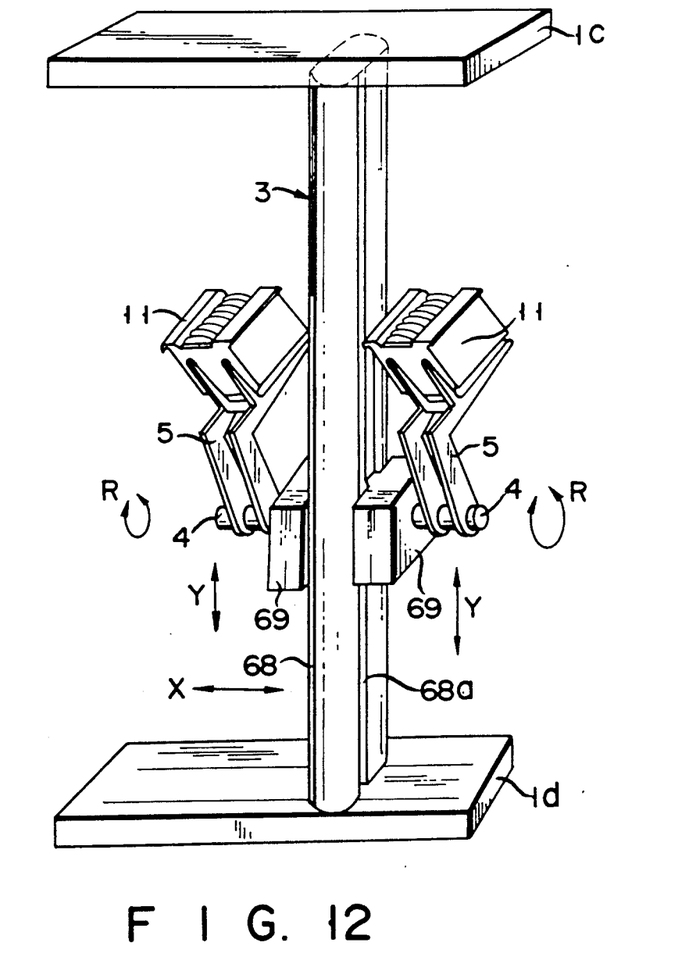
FIG. 12 is a perspective view of a handling apparatus having two rocking arm.

As is shown in FIG. 12, two rocking mechanism boxes 69 may be employed such that they are vertically slidable along grooves 68a of vertical movement mechanism 3 independently of each other. Arm 5 is coupled to each box 69 by means of shaft 4. Arm 5 of one box and that of the other box are rockable independently of each other.

According to the modification shown in FIG. 12, two carriers can be simultaneously transported by use of one handling apparatus. Furthermore, two arms 5 may be attached to each shaft 4, if so desired.

Figure 13:
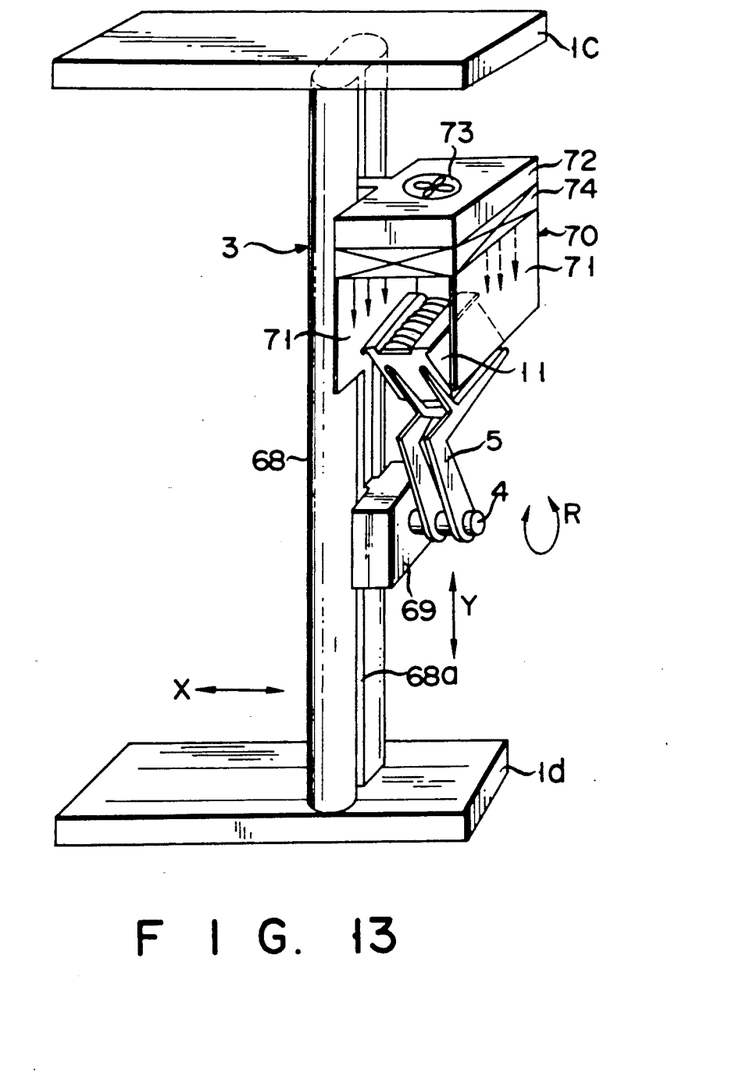
FIG. 13 is a perspective view of a handling apparatus having a fan-installed roof.

Air conditioning device 70 which can blow clean air against carrier 11 during transfer may be provided, as shown in FIG. 13. Air conditioning device 70 and rocking mechanism box 69 are coupled to each other, and they are driven, in the coupled state, along groove 68a of vertical movement mechanism 3. Fan 73 is attached to roof 72 of device 70, such that downward air is blown against carrier 11 after it is made to pass through filter 74.

According to the modification shown in FIG. 13, when carrier 11 is transferred, it is kept surrounded by side plate 71 and roof 72 of device 70. Further, clean air is constantly blown against carrier 11. Therefore, the wafers stored in carrier 11 can be kept clean.

In the above-mentioned embodiments of the invention, description has been made of the case where semiconductor wafers are transferred in a clean room, but this invention is not limited to the above embodiments and may be used to transfer other plate-shaped materials such as liquid crystal substrates.

According to this invention, carrier movement can be realized by a theoretically minimum number of axes and the apparatus construction has been simplified. Therefore, it is possible to limit the generation of dust during operation to a minimum. In addition, the driving mechanism of the handling apparatus is installed close to the floor of the clean room. As a result, the laminar flow of clean air is least liable to be disturbed. Hence, in the clean room which is required to meet a high required level of cleanliness, it is possible to use the handling apparatus of this invention for a long time continuously. This invention also offers an economical advantage that the cost of the handling apparatus is lower than before. According to this invention, in all situations of placement and movement and placement, the cleanliness of the carrier being transferred is maintained.

What is claimed is:

1. A handling apparatus operable in a clean room, comprising:
    transferring means for transferring a box-like carrier between a storage compartment and a loading/unloading stage in said clean room, said transferring means including an arm member which has a prongshaped loading portion by means of which said arm member picks up the box-like carrier and a main arm portion curved like a boomerang;
    rocking means, provided in a portion which is lower than said prongshaped loading portion, for rocking said arm member; and
    moving means for moving said transferring means to the loading/unloading stage, picking up the box-like carrier placed on the loading/unloading stage, moving the carrier so as to be overhead of the rocking means via said arm member, and moving said transferring means to the storage compartment where the arm member is rocked so as to discharge the carrier from the loading portion.

2. The handling apparatus according to claim 1, wherein said means for moving said means for transferring said carrier includes vertical and horizontal moving means.

3. The handling apparatus according to claim 1, wherein a contact preventive sensor and a sensor for confirming the presence of an object are attached to the loading portion.

4. The handling apparatus according to claim 1, wherein said loading portion is configured such that the arm member has a finger extending at right angles therefrom and said loading portion is capable of holding a picked-up object without allowing it to fall, even when the held position of the picked-up object is changed.

5. The handling apparatus according to claim 1, wherein said arm member is contoured so as to have a smooth aerofoil shape.

6. The handling apparatus according to claim 2, wherein said vertical moving means and said rocking means are contoured so as to have a streamlined shape.

7. The handling apparatus according to claim 1, wherein a direct driving mechanism is used as means for rocking said arm member.

8. The handling apparatus according to claim 1, wherein a wrapping connector driving mechanism is used as means for rocking said arm member.

9. The handling apparatus according to claim 2, wherein a ball screw and a nut are used as vertical moving means.

10. The handling apparatus according to claim 2, wherein a gear driving mechanism is used as horizontal driving means.

11. The handling apparatus according to claim 2, wherein a gear driving mechanism is used as vertical moving means.

12. The handling apparatus according to claim 2, wherein a linear guide mechanism is provided for the vertical moving means.

13. The handling apparatus according to claim 2, wherein a linear guide mechanism is provided for the horizontal moving means.

14. The handling apparatus according to claim 2, wherein a wrapping connector driving mechanism is provided for the horizontal moving means.

15. The handling apparatus according to claim 1, wherein said transferring means is mounted on a carriage.

16. The handling apparatus according to claim 1, wherein the transferring means is mounted on a carriage and said carriage is guided along a rail.

17. The apparatus according to claim 1, which comprises vertical movement means wherein said arm member comprises a pair of parallel arms connected at one end to said vertical movement means.

18. A method for transferring box-like carriers by use of a handling apparatus in a clean room, comprising:
means for transferring a box-like carrier between a storage compartment and a loading/unloading stage in said clean room, said means for transferring said carrier including an arm member which has a prongshaped loading portion by means of which said arm member picks up the box-like carrier and a main arm portion curved like a boomerang;
rocking means, provided in a portion which is lower than said prongshaped loading portion, for rocking said arm member; and
moving means for moving said transferring means to the loading/unloading stage, picking up the box-like carrier placed in the loading/unloading stage, moving the carrier so as to be overhead of the rocking means via said arm member, and moving said transferring means to the storage compartment where the arm member is rocked so as to discharge the carrier from the loading portion,
said method comprising the steps of:
picking up at least one of a plurality of box-like carriers placed on the loading/unloading stage and loading the picked-up carrier onto the loading portion of the means for transferring said carrier, bu use of the means for moving said means for transferring said carrier and rocking means;
moving the carrier from the loading/unloading stage to the storage compartment, bu use of the means for moving said means for transferring said carrier, while making the rocking means unswayable; and
discharging the picked-up carrier from the loading portion in the stage compartment, bu use of said means for moving said means for transferring said carrier and said rocking means.

19. The method of transferring carriers according to claim 18, wherein a single handling apparatus transfers two or more carriers at the same time.

20. The method according to claim 18, wherein while the box-like carrier is transferred by said means for transferring said carrier, an inclination of the carrier is changed in accordance with a direction of flow of clean air, so as to decrease air resistance to the carrier during the transfer thereof.

* * * * *